United States Patent
Fukunaga et al.

[11] Patent Number: 5,908,042
[45] Date of Patent: Jun. 1, 1999

[54] BASKET FOR CLEANING SEMICONDUCTOR WAFERS AND METHOD OF CLEANING SEMICONDUCTOR WAFERS USING THE SAME

[75] Inventors: Hisaya Fukunaga; Katsutoshi Kurogi, both of Kanagawa, Japan

[73] Assignee: Komatsu Electronic Metals Co., Ltd., Kanagawa, Japan

[21] Appl. No.: 08/885,806

[22] Filed: Jun. 30, 1997

[30] Foreign Application Priority Data

Jun. 29, 1996 [JP] Japan ................................. 8-204068

[51] Int. Cl.$^6$ ............................. B08B 11/00; B08B 11/02
[52] U.S. Cl. .......................... 134/25.1; 134/25.4; 134/82; 134/902
[58] Field of Search .................. 134/902, 2, 38, 134/40, 42, 25.1, 25.4, 82; 438/464, 906; 125/20, 23.01

[56] References Cited

U.S. PATENT DOCUMENTS

| | | | |
|---|---|---|---|
| 4,771,759 | 9/1988 | Zoebeli | 125/13.01 |
| 5,715,806 | 2/1998 | Tonegawa et al. | 125/16.02 |
| 5,806,137 | 9/1998 | Ishi et al. | 15/302 |

FOREIGN PATENT DOCUMENTS 079014  5/1983  European Pat. Off. .

*Primary Examiner*—Jill Warden
*Assistant Examiner*—Alexander Markoff
*Attorney, Agent, or Firm*—Sughrue, Mion, Zinn Macpeak & Seas, PLLC

[57] ABSTRACT

A basket for cleaning semiconductor wafers is provided which can catch semiconductor wafers or semiconductor pieces slipping off from a slicing plate so as to prevent them from dropping, and which can hold semiconductor wafers even after the wafers are separated from the slicing plate in a cleaning step.

The basket for cleaning semiconductor wafers, includes: at least two upstanding side walls on which ends of a slicing plate are to be respectively placed; at least two side holding rods which are substantially horizontally disposed between side portions of the sidewalls 21, 22, the side holding rods 31, 32 being separated from each other by a distance which is slightly larger than diameters of semiconductor wafers to be housed in the basket; a bottom plate which is formed between lower portions of the side walls; and two clamping rods which are horizontally movable along the side holding rods, thereby the semiconductor wafers sliced on the slicing plate are clamped by moving the clamping rods 51, 52.

5 Claims, 3 Drawing Sheets

BASKET FOR CLEANING SEMICONDUCTOR WAFERS AND METHOD OF CLEANING SEMICONDUCTOR WAFERS USING THE SAME

BACKGROUND OF THE INVENTION

1. Field of the Invention

The invention relates to a basket for cleaning which holds semiconductor wafers cut by a wire saw and a method of cleaning semiconductor wafers using the same, in a cleaning step of removing away abrasive grains and grease components from the wafers.

2. Description of the Prior Art

Conventionally, semiconductor wafers which have been cut by a wire saw are arranged under a state where their peripheral portions are bonded to a slicing plate made of carbon or the like, and then transported to a cleaning bath while being hung from a lifter. The semiconductor wafers are cleaned in the cleaning bath so that abrasive grains and grease components are removed away from the wafers. Thereafter, the semiconductor wafers are finally caused to be separated from the slicing plate, by an alkaline cleaning fluid. The separated semiconductor wafers are piled up in the cleaning bath, and then picked up.

In order to align the crystal orientations of semiconductor wafers, the cutting work using a wire saw must be conducted while adjusting the cutting direction of a semiconductor ingot. Therefore, the end portions of the ingot are cut into an irregular shape, and a part of the irregular-shape portions surely drops off. During the cleaning for removing abrasive grains and grease components, sometimes, several semiconductor wafers slip off from the slicing plate. These slipping off semiconductor wafers or semiconductor pieces produce a problem in that they drop into the cleaning bath and crack to cause a trouble in a cleaning apparatus.

When the semiconductor wafers are separated from the slicing plate in the cleaning bath, the wafers lose the support and fall over like a file of dominoes. This produces a problem in that, when the semiconductor wafers are then to be transferred to a wafer carrier, the efficiency of the work of picking up wafers is poor.

The invention has been conducted in view of the problems discussed above.

SUMMARY OF THE INVENTION

It is an object of the invention to provide a basket for cleaning semiconductor wafers which can catch semiconductor wafers or semiconductor pieces slipping off from a slicing plate so as to prevent them from dropping, and which can hold semiconductor wafers even after the wafers are separated from the slicing plate in a cleaning step.

In order to attain the object, the basket of the invention comprises: at least two upstanding side walls on which ends of a slicing plate are to be respectively placed; at least two side holding rods which are substantially horizontally disposed between side portions of the side walls, the side holding rods being separated from each other by a distance which is slightly larger than diameters of semiconductor wafers to be housed in the basket; a bottom plate which is formed between lower portions of the side walls; and two clamping rods which are horizontally movable along the side holding rods, the semiconductor wafers being clamped by moving the clamping rods.

A method of cleaning semiconductor wafers using the basket comprising steps of: slicing an semiconductor ingot into semiconductor wafers after fixing the semiconductor ingot to the slicing plate with adhering agent, placing the slicing plate on which the semiconductor wafers are fixed on the side walls of the basket; putting the basket on which the slicing plate is placed, into washing bath; holding the semiconductor wafers separated from the slicing plate between the side holding rods; clamping the semiconductor wafers by moving the side holding rods; and picking up the semiconductor wafers from the washing bath by lifting the basket.

DESCRIPTION OF THE PREFERRED EMBODIMENT

The basket for cleaning semiconductor wafers according to the invention is used in a cleaning step in which semiconductor wafers cut by a wire saw are cleaned so as to remove away abrasive grains and grease components adhering to the semiconductor wafers. The basket houses and holds the semiconductor wafers fixed to a slicing plate, and comprises: holding rods and a bottom net which catch semiconductor wafers or semiconductor pieces slipping off from the slicing plate in the cleaning step so as to prevent them from dropping; and clamping rods which, when the semiconductor wafers are separated from the slicing plate, support the semiconductor wafers by clamping the wafers so as to prevent the wafers from falling over like a file of dominoes.

Semiconductor wafers which have been cut by a wire saw are cleaned while the wafers are housed in the basket for cleaning semiconductor wafers according to the invention. When the semiconductor wafers are then separated from the slicing plate in the final cleaning step and the slicing plate is removed or lifted up from the cleaning bath, the semiconductor wafers and semiconductor pieces in a state where they are piled up can be picked up.

Hereinafter, an embodiment of the invention will be described with reference to the accompanying drawings.

Figure 1:
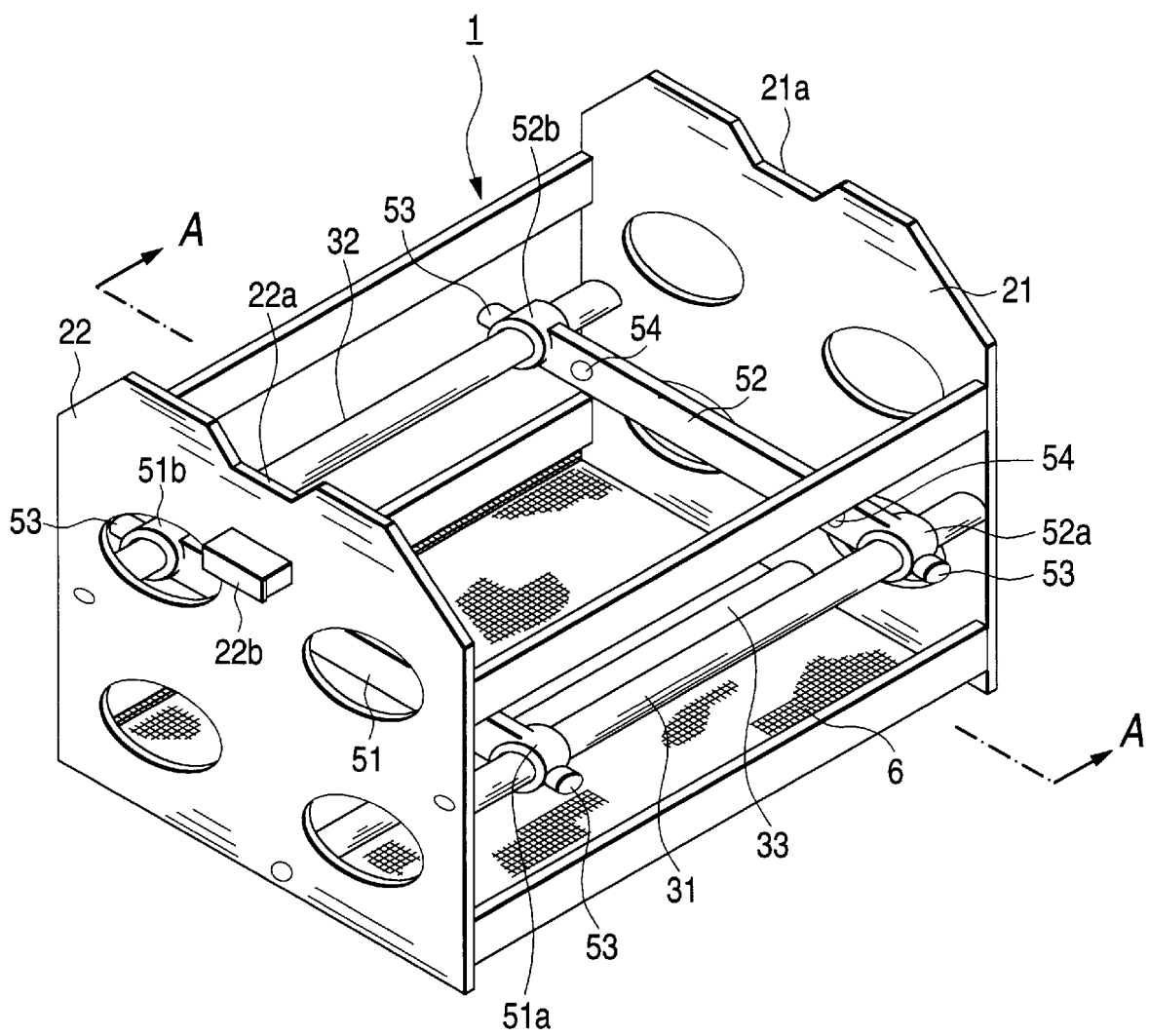
FIG. 1 is a perspective view of a cleaning basket according to the invention.
Figure 2A:
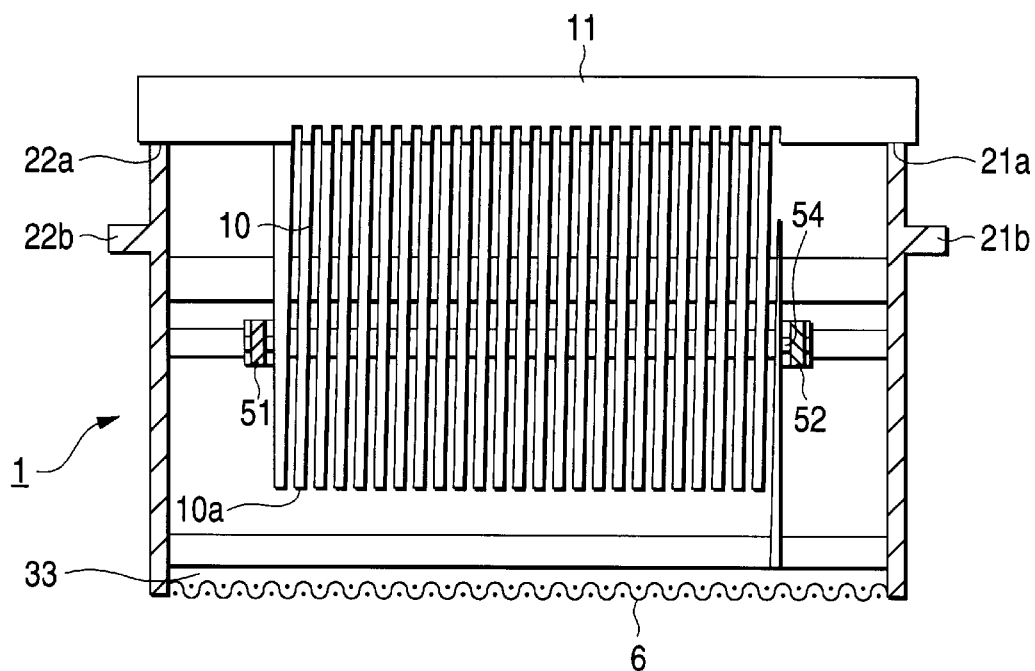
FIG. 2(a) and FIG. 2(b) are respectively a side section view showing a state where semiconductor wafers are housed in the basket and separated from a slicing plate.
Figure 2B:
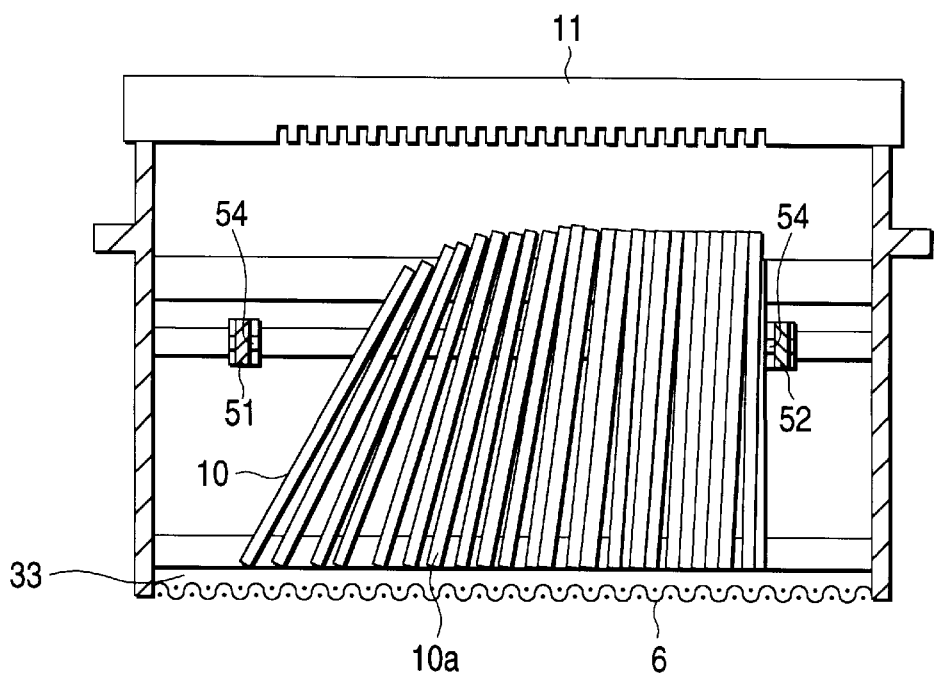
Figure 3:
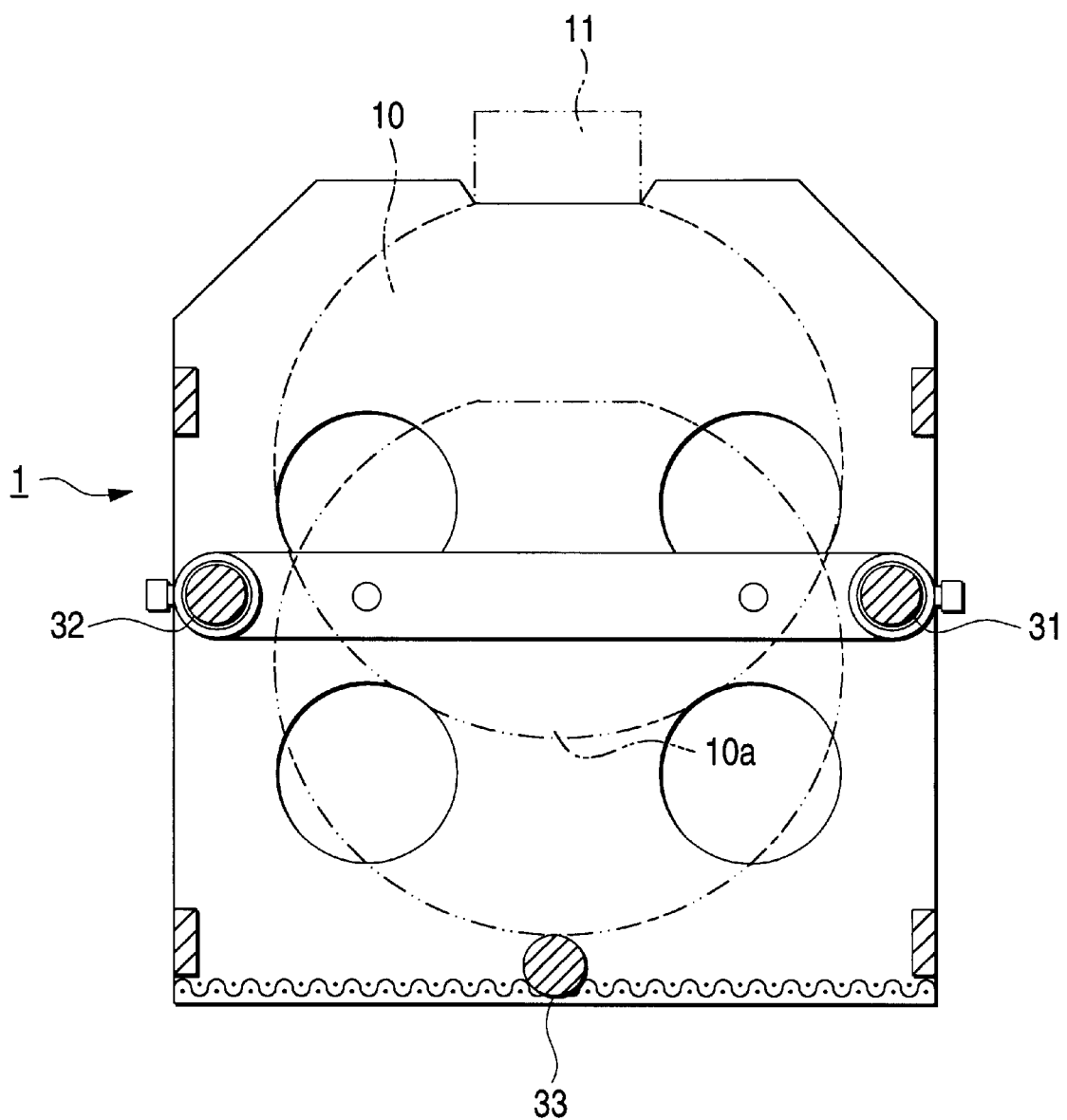
FIG. 3 is a section view taken along line A—A of FIG. 1.

FIG. 1 is a perspective view of a cleaning basket according to the invention, FIG. 2(a) and FIG. 2(b) are respectively a side section view showing a state where semiconductor wafers are housed in the basket and separated from a slicing plate, and FIG. 3 is a section view taken along line A—A of FIG. 1.

Referring to FIG. 1, the cleaning basket 1 of the embodiment comprises: two upstanding side walls 21 and 22; two side holding rods 31 and 32 which are horizontally disposed between the side walls 21 and 22; one bottom holding rod 33 which is horizontally disposed between lower portions of the side walls 21 and 22; a bottom net 6 which is placed between lower portions of the side walls; and two clamping rods 51 and 52 which are held at both ends by the side holding rods 31 and 32 so as to be horizontally movable along the side holding rods 31 and 32.

As shown in FIG. 1, recesses 21a and 22a are formed at the tops of the side walls 21 and 22, respectively. As shown in FIG. 2(a), the ends of a slicing plate 11 are respectively placed on the recesses 21a and 22a so as to be held by the side walls, thereby conducting the positioning of semiconductor wafers 10 housed in the cleaning basket 1.

Lifting hooks 21b and 22b are outward projected from the outer side faces of the side walls 21 and 22, respectively. When the semiconductor wafers 10 are to be moved among cleaning baths, the lifting hooks 21b and 22b are held and the wafers are then transported together with the cleaning basket 1.

As shown in FIG. 3 the side holding rods 31 and 32 are separated from each other by a distance which is slightly larger than the diameters of the semiconductor wafers 10 to be housed in the cleaning basket 1 so that the peripheral edges of the semiconductor wafers 10 which are housed and positioned as described above do not contact with the side holding rods 31 and 32.

As shown in FIGS. 2(a) and 3, the bottom holding rod 33 is placed so that a gap is formed between the bottom holding rod and the lower end portions 10a of the semiconductor wafers 10 fixed to the slicing plate 11 and housed in the cleaning basket 1. As a result, the semiconductor wafers 10 fixed to the slicing plate 11 are held in the cleaning basket 1 while the peripheral edges of the wafers are prevented from contacting with a portion other than the slicing plate 11. In the cleaning process, therefore, the whole face of each semiconductor wafer 10 can be thoroughly cleaned, and, even when vibrations or the like are applied, the semiconductor wafers do not suffer damage due to contacts with the parts of the cleaning basket 1.

As shown in FIGS. 2(b) and 3, when the semiconductor wafers 10 are separated from the slicing plate 11, the lower end portions 10a of the wafers are caught by the bottom holding rod 33.

As shown in FIG. 1, each of the end portions 51a and 51b, and 52a and 52b of the two clamping rods 51 and 52 is formed into an annular shape. The side holding rods 31 and 32 are passed through the corresponding end portions, so as to make the clamping rod horizontally movable. A fixing bolt 53 is disposed on the outer side of each of the end portions. As shown in FIG. 2(a), the clamping rods 51 and 52 are positioned in accordance with the number of the semiconductor wafers 10, and then fixed, thereby clamping the semiconductor wafers 10. As a result, when the semiconductor wafers are separated from the slicing plate, they are prevented from falling over like a file of dominoes, as shown in FIG. 2(b).

Furthermore, as shown in FIG. 1, two elastic projections 54 are formed on a face of each of the clamping rods 51 and 52 which face opposes one of the semiconductor wafers 10. Even when vibrations or the like are applied during the cleaning process, therefore, the semiconductor wafers do not suffer damage due to contacts with the clamping rods.

As shown in FIG. 1 the bottom net 6 is disposed below the bottom holding rod 33 and fixed to the lower end portions of the side walls 21 and 22. Even when semiconductor pieces having an irregular shape and originating from the end portions (ears) of the semiconductor ingot drop off through the holding rods, the bottom net 6 catches the pieces so as to prevent the pieces from dropping into the cleaning bath.

In the invention configured as described above, semiconductor wafers or semiconductor pieces slipping off from a slicing plate are caught, thereby preventing them from dropping, and semiconductor wafers can be held even after the wafers are separated from the slicing plate in a cleaning step. Therefore, the invention can attain excellent effects that the cleaning after the cutting work using a wire saw can be surely conducted, and that the semiconductor wafers can be thereafter easily picked up.

What is claimed is:

1. A basket for separating semiconductor wafers from a slicing plate and cleaning the semiconductor wafers, comprising:

at least two upstanding side walls on which ends of the slicing plate with attached semiconductor wafers are to be respectively placed;

at least two side holding rods which are substantially horizontally disposed between side portions of the side walls, the side holding rods being separated from each other by a distance which is larger than diameters of the semiconductor wafers to be housed in the basket;

a bottom plate which is formed between lower portions of the side walls;

and two clamping rods which are horizontally movable along the side holding rods, to clamp the semiconductor wafers separated from the slicing plate and housed in the basket.

2. The basket for cleaning semiconductor wafers according to claim 1, wherein at least one bottom holding rod is substantially horizontally disposed between the lower portions of the side walls, and the bottom holding rod is placed so that a gap is formed between lower ends of the semiconductor wafers fixed to the slicing plate and the bottom holding rod, in the case of the slicing plate being placed on the side walls.

3. The basket for cleaning semiconductor wafers according to claim 1, wherein an elastic projection is formed on a face of each of the clamping rods, the face opposing one of the semiconductor wafers.

4. The basket for cleaning semiconductor wafers according to claim 1, wherein the bottom plate is formed into a net-like shape.

5. A method of cleaning semiconductor wafers using the basket as set forth in claim 1, comprising steps of:

slicing an semiconductor ingot into semiconductor wafers after fixing the semiconductor ingot to the slicing plate with adhering agent, placing the slicing plate on which the semiconductor wafers are fixed on the side walls of the basket;

putting the basket on which the slicing plate is placed, into washing bath;

separating the semiconductor wafers from the slicing plate;

holding the semiconductor wafers separated from the slicing plate between the side holding rods;

clamping the semiconductor wafers by moving the side holding rods;

and picking up the semiconductor wafers from the washing bath by lifting the basket.

* * * * *